United States Patent
Troy

(10) Patent No.: US 11,309,056 B2
(45) Date of Patent: Apr. 19, 2022

(54) AUTOMATIC TEST EQUIPMENT METHOD FOR TESTING SYSTEM IN A PACKAGE DEVICES

(71) Applicant: Octavo Systems LLC, Sugar Land, TX (US)

(72) Inventor: Kevin Michael Troy, College Station, TX (US)

(73) Assignee: OCTAVO SYSTEMS LLC, Sugar Land, TX (US)

( * ) Notice: Subject to any disclaimer, the term of this patent is extended or adjusted under 35 U.S.C. 154(b) by 77 days.

(21) Appl. No.: 16/482,063

(22) PCT Filed: Jan. 31, 2018

(86) PCT No.: PCT/US2018/016171
§ 371 (c)(1),
(2) Date: Jul. 30, 2019

(87) PCT Pub. No.: WO2018/144561
PCT Pub. Date: Aug. 9, 2018

(65) Prior Publication Data
US 2020/0058364 A1 Feb. 20, 2020

Related U.S. Application Data

(60) Provisional application No. 62/452,606, filed on Jan. 31, 2017.

(51) Int. Cl.
*G11C 29/56* (2006.01)
*G11C 29/00* (2006.01)
(Continued)

(52) U.S. Cl.
CPC ........ *G11C 29/56* (2013.01); *G01R 31/31713* (2013.01); *G01R 31/31813* (2013.01); *G01R 31/318552* (2013.01)

(58) Field of Classification Search
CPC ........ G01R 31/31713; G01R 31/31813; G01R 31/318505; G01R 31/318552;
(Continued)

(56) References Cited

U.S. PATENT DOCUMENTS 8,065,576 B2    11/2011   Miner et al.
8,358,147 B2 *   1/2013   Pagani ............ G01R 31/31905
                                                                    324/762.02
(Continued)

OTHER PUBLICATIONS

International Search Report and Written Opinion issued for International Application No. PCT/US2018/016171 dated Apr. 25, 2018, 7 pages.

*Primary Examiner* — Justin R Knapp
(74) *Attorney, Agent, or Firm* — Rothwell, Figg, Ernst & Manbeck, P.C.

(57) ABSTRACT

Systems, methods, and computer program products directed to testing a System-in-a-Package (SIP) using an Automatic Test Equipment (ATE) machine. A functional representation of one or more tests to be performed in the SIP is loaded in a memory located on a load board, the load board located on the ATE machine. A test controller located on at least one of the SIP and the load board is caused to retrieve and store the one or more tests to be performed in the SIP. The test controller is instructed to conduct the one or more tests in the SIP.

20 Claims, 16 Drawing Sheets

(51) Int. Cl.
*G01R 31/00* (2006.01)
*G01R 31/317* (2006.01)
*G01R 31/3181* (2006.01)
*G01R 31/3185* (2006.01)

(58) Field of Classification Search
CPC .. G01R 31/3177; G01R 31/01; G01R 31/317; G01R 31/3181; G01R 31/3185; G11C 29/56; G06F 19/00
See application file for complete search history.

(56) References Cited

U.S. PATENT DOCUMENTS

| | | |
|---|---|---|
| 2003/0110427 A1 | 6/2003 | Rajsuman et al. |
| 2010/0050019 A1* | 2/2010 | Miner ................... G06F 11/267 714/30 |
| 2010/0134133 A1 | 6/2010 | Pagani |

* cited by examiner

500

AUTOMATIC TEST EQUIPMENT METHOD FOR TESTING SYSTEM IN A PACKAGE DEVICES

CROSS REFERENCE TO RELATED APPLICATION

This application is a 35 U.S.C. § 371 National Stage of International Patent Application No. PCT/US2018/016171, filed Jan. 31, 2018, designating the United States, which claims the benefit of U.S. Provisional Application No. 62/452,606 which was filed Jan. 31, 2017, the disclosures of which are incorporated herein in their entirety by reference.

TECHNICAL FIELD

Aspects of this disclosure relate to methods for testing a System in a Package (SIP) using an Automatic Test Equipment (ATE) machine.

BACKGROUND

Semiconductor device manufacturers can use Automatic Test Equipment (ATE) machines, like the Teradyne J750, to test devices. An ATE uses input vectors that are designed to test for and uncover faults in the Device Under Test (DUT) by comparing the actual output vectors or values to the expected output values. In some instances, the use of a load board can enable automatic handling and high test throughput of devices, which in turn reduces the cost of testing. However, as the level of device integration increases so does the cost and complexity of testing.

Testing a DUT comprises transmitting one or more test signals to the inputs of the DUT, and then analyzing the output from the DUT. The DUT can be a single die integrated circuit (IC) or a System-on-Chip (SOC) under test. DUTs that produce the correct output responses for all inputs are considered to pass the test. DUTs that fail to produce a correct response at any point during the sequence of tests are assumed to be faulty. In digital IC testing, the test signals ("test vectors") essentially comprise logic 1's and 0's. In order to test a circuit with "n" inputs and "m" outputs, a set of n test vectors are applied to the DUT one group at a time. Accordingly, the DUT generates m test vector outputs, and the outputs are compared to the expected outputs of a fault-free circuit.

Two processes are required for this type of ATE test: (1) the generation of test vectors and expected results for a prospective DUT and (2) the application of those test vectors to that DUT. The input test vectors and expected output values can be derived from design and simulation data for a DUT through the use of Automatic Test Pattern Generation (ATPG) tools. In a System-on-Chip (SOC), there may be subsystems designed by a party other than the device manufacturer. The designer or provider of the subsystems in the SOC will typically supply the test vectors and expected results, or the necessary information for generation of test vectors to the SOC device manufacturer.

A conventional method of testing SIPs is to individually test each component in a SIP, but this involves multiple insertions in multiple testers that are each specific to an individual component. Such a method is time consuming and often redundant because the components have already been individually tested at least once as part of the fabrication process. Additionally, in case of any memory testing, the test times may be very long and cost prohibitive. However, if the memory is not tested using a SIP's processor, the critical processor-memory interface remains unverified. Another disadvantage of testing components individually in a SIP is that system level connectivity and functionality internal to the SIP cannot be verified. Further, it is difficult, if not impossible, to pin out all of the components and devices contained in a SIP for such individual testing as there are typically multiple interconnections and each device in the SIP may have more potential pins than are available in the SIP package for all the devices contained in that SIP.

Another conventional method of testing an SIP is to operate the SIP as if it is in the designated end equipment. For example, the SIP may be operated to boot up a program or execute simple tasks. This method mimics the function of the system under test with a pseudo system. This conventional method involves loading an operating system such as Linux and performing basic tasks. Similarly, other functional blocks such as memory, USB, analog-to-digital converter (ADC) may be tested sequentially. While this exercises most parts of the system under test, it is typically not exhaustive and is generally more time consuming than using an ATE directed test. This method may be used on systems on the board level or SIPs. Additionally, this method does not provide visibility into the location or cause of any failure because a pass/fail signal for the entire system is given when the system under test is determined to faulty.

There remains a need for testing procedures and systems that effectively and efficiently test SIP-type devices.

SUMMARY

Testing a System-in-Package (SIP) device with an ATE machine requires a different test methodology from the methodology of an integrated circuit. Typically, a SIP has multiple integrated circuits, both in die form and in packaged form along with passive devices among others. In contrast, an integrated circuit, also referred to as a System on Chip (SOC), has one circuit in the package with typically no passives and other peripheral devices. The SOC also has test hardware designed into it so that the entire device can be tested with test vectors from an ATE. Due to these differences, SIPs and SOCs must be tested differently. But since SIPs may be assembled (and packaged) on the same production lines as an SOC, or other integrated circuits, the testers used to test packaged SOCs are used to test the packaged SIP devices. Therefore, the test methodology and test hardware must be altered in order to test a SIP with an ATE. That is, there is a need for the ATE to be modified to shift from being a component tester to being a system tester.

The physical and logical limitations to vector-based ATE testing used for SOCs require a different methodology for testing SIPs.

According to some embodiments, a SIP containing a processor can host and execute functional test software to provide a Built in Self Test (BIST) capability. In certain aspects, the ATE programming required to interface with the BIST software used in SIPs is different from the interface in an SOC.

For example, the ATE programming for BIST software may be more than just pattern generation and data capture as with SOC vector-based testing. In some embodiments, the ATE interface with BIST software may use interactive state machines with control signals, data signals, and a set of commands. In another embodiment, a first state machine in the ATE and a second state machine in a test controller may be employed. In such embodiments, the test controller may be located in a device under test/unit under test (DUT/UUT)

or on the ATE load board. Control signals from the ATE to the UUT may specify when other signals being sent to the UUT are data. Similarly, control signals from the UUT to the ATE may specify when signals being sent from the UUT to the ATE are results of the conducted tests. Command signals transmitted from the ATE to the UUT may specify what actions the UUT is to perform on or with the data the UUT receives from the ATE.

According to some embodiments, a method performed by an Automatic Test Equipment (ATE) machine for testing a System-in-a-Package (SIP) using the ATE machine is provided. The method includes loading a functional representation of one or more tests to be performed in the SIP in a memory located on a load board. In some embodiments, the load board is located on the ATE.

In some embodiments, the method further includes causing a test controller to retrieve and store the one or more tests to be performed in the SIP. In some embodiments, the method further includes causing the test controller to retrieve and store the state machine in the test controller. In some embodiments, the test controller is configured to use the state machine to conduct the one or more tests in the SIP. In some embodiments, the method further includes instructing the test controller to conduct the one or more tests in the SIP. In some embodiments, the test controller may be located on at least one of: the load board and the SIP. In some embodiments, the test controller is one of: a microprocessor, a microcontroller, a logic circuit, and configurable logic gates. In some embodiments, a state machine configured to execute the one or more tests in the SIP is loaded in the memory.

In some embodiments, the method further includes verifying the load board before loading the functional representation of one or more tests in the memory. In such embodiments, said loading may be performed after verifying the load board. In some embodiments, the method further includes conducting a first test to confirm proper external connections of the SIP before causing the test controller to retrieve and store the one or more tests. In such embodiments, the method may further include conducting a second test to measure and compare one or more of: voltage levels and clock frequencies of the SIP before causing the test controller to retrieve and store the one or more test.

In some embodiments, the method may further include receiving results from the test controller for each of the one or more tests. In such embodiments, the test controller may be controlled to: (1) continue conducting the one or more tests or (2) conclude conducting the one or more tests after receiving a test result for each of the one or more tests.

In some embodiments, the method may further include determining whether the SIP correctly passed the one or more tests based on the received test results. In such embodiments, the method may further include routing the SIP is routed to an appropriate bin based on the determination of whether the SIP correctly passed all of the one or more tests.

According to some embodiments, a computer program product comprising a non-transitory computer readable medium storing a computer program for testing a System-in-a-Package (SIP) using an Automatic Test Equipment (ATE) machine is provided. The computer program may comprise computer program code which, when run on the ATE machine, causes the ATE machine to perform a set of operations. The set of operations includes loading a functional representation of one or more tests to be performed in the SIP a memory located on a load board. In some embodiments, the load board is located on the ATE.

In some embodiments, the set of operations further includes causing a test controller to retrieve and store the one or more tests to be performed in the SIP. In some embodiments, the set of operations further includes causing the test controller to retrieve and store the state machine in the test controller. In some embodiments, the test controller is configured to use the state machine to conduct the one or more tests in the SIP. In some embodiments, the set of operations further includes instructing the test controller to conduct the one or more tests in the SIP. In some embodiments, the test controller may be located on at least one of: the load board and the SIP. In some embodiments, the test controller is one of: a microprocessor, a microcontroller, a logic circuit, and configurable logic gates. In some embodiments, a state machine configured to execute the one or more tests in the SIP is loaded in the memory.

In some embodiments, the set of operations further includes verifying the load board before loading the functional representation of one or more tests in the memory. In such embodiments, said loading may be performed after verifying the load board. In some embodiments, the set of operations further includes conducting a first test to confirm proper external connections of the SIP before causing the test controller to retrieve and store the one or more tests. In such embodiments, the set of operations may further include conducting a second test to measure and compare one or more of: voltage levels and clock frequencies of the SIP before causing the test controller to retrieve and store the one or more test.

In some embodiments, the set of operations may further include receiving results from the test controller for each of the one or more tests. In such embodiments, the test controller may be controlled to: (1) continue conducting the one or more tests or (2) conclude conducting the one or more tests after receiving a test result for each of the one or more tests.

In some embodiments, the set of operations may further include determining whether the SIP correctly passed the one or more tests based on the received test results. In such embodiments, the set of operations may further include routing the SIP is routed to an appropriate bin based on the determination of whether the SIP correctly passed all of the one or more tests.

According to some embodiments, a method performed by a test controller for testing a System-in-a-Package (SIP) using an Automatic Test Equipment (ATE) machine is provided. The method includes receiving a command transmitted by the ATE machine. In some embodiments, the test controller is located on at least one of: the load board and the SIP. In some embodiments, the test controller is one of: a microprocessor, a microcontroller, a logic circuit, and configurable logic gates. In some embodiments, the load board comprises a memory, said memory comprising the one or more tests to be performed in the SIP and a state machine configured to execute the one or more tests in the SIP.

In some embodiments, the method may further include executing the command, wherein the command comprises instructions to conduct one or more tests in the SIP. In some embodiments, executing the command may comprise the test controller retrieving the one or more tests from the memory. In some embodiments, executing the command may comprise the test controller retrieving the state machine from the memory and using the state machine to conduct the one or more tests in the SIP.

In some embodiments, the method may further include determining whether the command signal is valid. In such embodiments, the test controller may execute the command as a result of determining that the command signal is valid.

In some embodiments, the method may further include determining whether a result of the executed command is valid. In such embodiments, the test controller may send the results of the one or more tests to the ATE machine as a result of determining that the result of the executed command is valid.

According to some embodiments, a computer program product comprising a non-transitory computer readable medium storing a computer program for testing a System-in-a-Package (SIP) using an Automatic Test Equipment (ATE) machine is provided. The computer program may comprise computer program code which, when run a test controller, causes the test controller to perform a set of operations.

The set of operations includes receiving a command transmitted by the ATE machine. In some embodiments, the test controller is located on at least one of: the load board and the SIP. In some embodiments, the test controller is one of: a microprocessor, a microcontroller, a logic circuit, and configurable logic gates. In some embodiments, the load board comprises a memory, said memory comprising the one or more tests to be performed in the SIP and a state machine configured to execute the one or more tests in the SIP.

In some embodiments, the set of operations may further include executing the command, wherein the command comprises instructions to conduct one or more tests in the SIP. In some embodiments, executing the command may comprise the test controller retrieving the one or more tests from the memory. In some embodiments, executing the command may comprise the test controller retrieving the state machine from the memory and using the state machine to conduct the one or more tests in the SIP.

In some embodiments, the set of operations may further include determining whether the command signal is valid. In such embodiments, the set of operations may include executing the command as a result of determining that the command signal is valid.

In some embodiments, the set of operations may further include determining whether a result of the executed command is valid. In such embodiments, the set of operations may include sending the results of the one or more tests to the ATE machine as a result of determining that the result of the executed command is valid.

According to some embodiments, a method performed by an Automatic Test Equipment (ATE) machine for testing a System-in-a-Package (SIP) using the ATE machine is provided. In some embodiments, the ATE machine may comprise a load board. The method may include verifying the load board. In some embodiments, the method may further include conducting one or more power-off tests on the SIP. In some embodiments, the SIP is loaded on the load board and the one or more power-off tests comprise a continuity test. In some embodiments, the method may further include conducting one or more power-on tests on the SIP. In some embodiments, the one or more power-on tests comprise voltage measurements. In some embodiments, the method may further include instructing a test controller to conduct one or more power-on tests in the SIP by performing a process comprising releasing a reset for the test controller and verifying the test controller boot. In some embodiments, the test controller is located on one of the load board and the SIP. In some embodiments, the test controller is one of: a microprocessor, a microcontroller, a logic circuit, and configurable logic gates. In some embodiments, the one or more power-on tests conducted by the test controller may comprise a MAC ID read, a DRAM test, a general purpose input output (GPIO) test, an analog-to-digital converter (ADC) test, and one or more frequency tests.

In some embodiments, the method may further include determining whether the SIP correctly passed the one or more power-off tests and the one or more power-on tests. In such embodiments, the method may further include sorting the SIP to an appropriate bin based on the determination of whether the SIP correctly passed the one or more power-off tests and the one or more power-on tests.

BRIEF DESCRIPTION OF THE DRAWINGS

The accompanying drawings, which are incorporated herein and form part of the specification, illustrate various embodiments.

DETAILED DESCRIPTION

Figure 1:
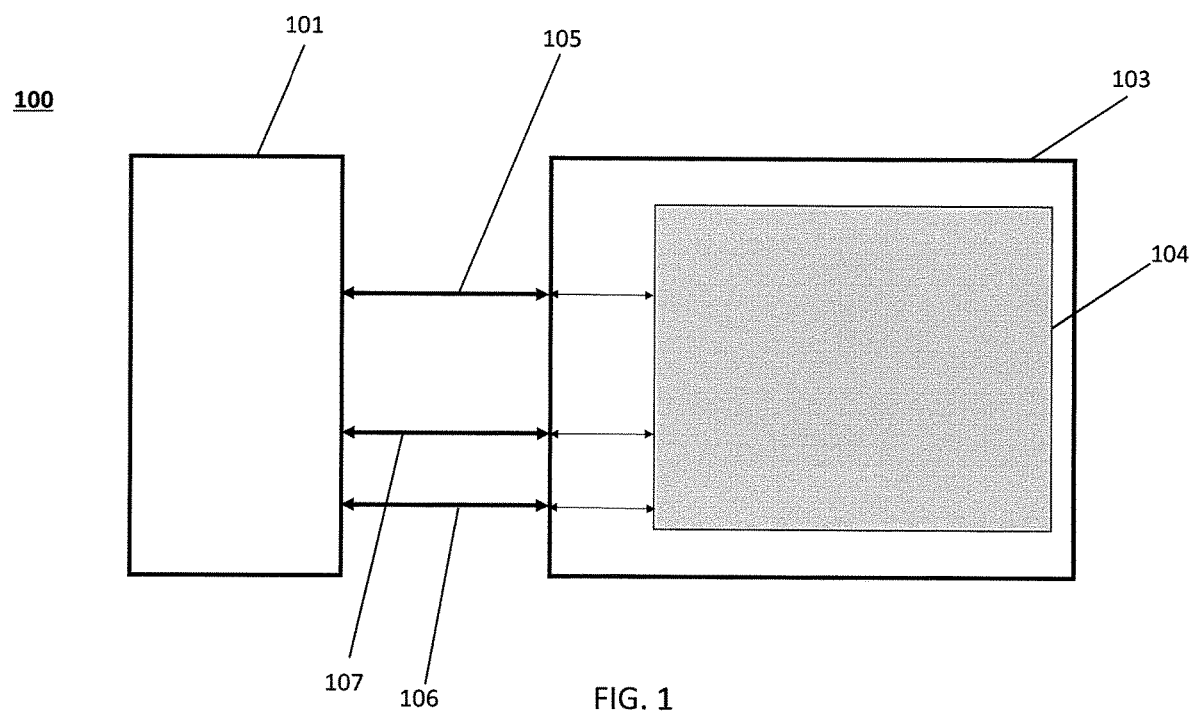
FIG. 1 depicts a block diagram of a system of testing an integrated circuit device on a load board using Automatic Test Equipment (ATE).

FIG. 1 depicts a simplified block diagram of a system for testing a single die integrated circuit device on a load board using Automatic Test Equipment (ATE). As shown in FIG. 1, the block diagram for testing comprises an Automatic Test Equipment (ATE) 101 and an integrated circuit Device Under Test (DUT) 104 (e.g., a SOC) on a load board 103. An exemplary process of testing the DUT 104 comprises the ATE 101 powering up the DUT 104 using power lines 107, performing continuity checks on the DUT 104, and then performing various parametric tests to ensure that the DUT 104 performs correctly over the voltages, frequencies and other ranges of the DUT 104 specification.

The ATE testing is accomplished by sequentially sending test vectors using a plurality of connections (e.g., scan chains) 105 and other connections/pins (input/output connections) 106 to the DUT 104. The test vectors are processed by the DUT 104 and the resulting output vectors may be returned to the ATE 101 using the same connections. The ATE 101 may determine whether the DUT 104 is good or faulty after all of the test vectors have been run by the DUT 104. In some instances, when the ATE 101 determines that the DUT 104 is faulty due to a failed test, the testing of the DUT 104 is stopped and a new DUT 104 is loaded for testing. In other instances, the testing may continue for the DUT 104 with the failed test recorded and/or noted. As explained above, ATE 101 makes a determination regarding a failed test by comparing actual test results from the DUT 104 with expected test results. The test vectors used for such actual tests are a series of signals that are applied to the DUT 104 inputs and/or special test inputs. The test vectors may be digital or analogue. In embodiments where the DUT 104 is a packaged semiconductor device, the ATE 101 is able to maximize test coverage of the DUT 104 because the ATE 101 has direct access to all of the power lines 107, scan chains 105, and input/output connections 106. Typically, further information is generated by the ATE 101 to describe the various reasons why the DUT 104 failed a test.

In certain aspects, Built-in-Self-Test (BIST) circuitry may be integrated into a DUT, such as the DUT 104. Such BIST circuitry may be used to run test patterns within the DUT 104 and inter-subsystem. Utilizing BIST effectively can allow access to sub-systems otherwise not accessible from external pins and reduces the workload of the ATE 101. When BIST is used, the ATE 101 connects to and drives the inputs (e.g., test input vectors) to the BIST circuitry and collects the output data (e.g., test output vectors) from the BIST circuitry. As described above, such input vectors are designed to uncover specific anticipated faults in the DUT 104. Input vector may be generated using a process called ATPG (automatic test pattern generation).

Figure 2:
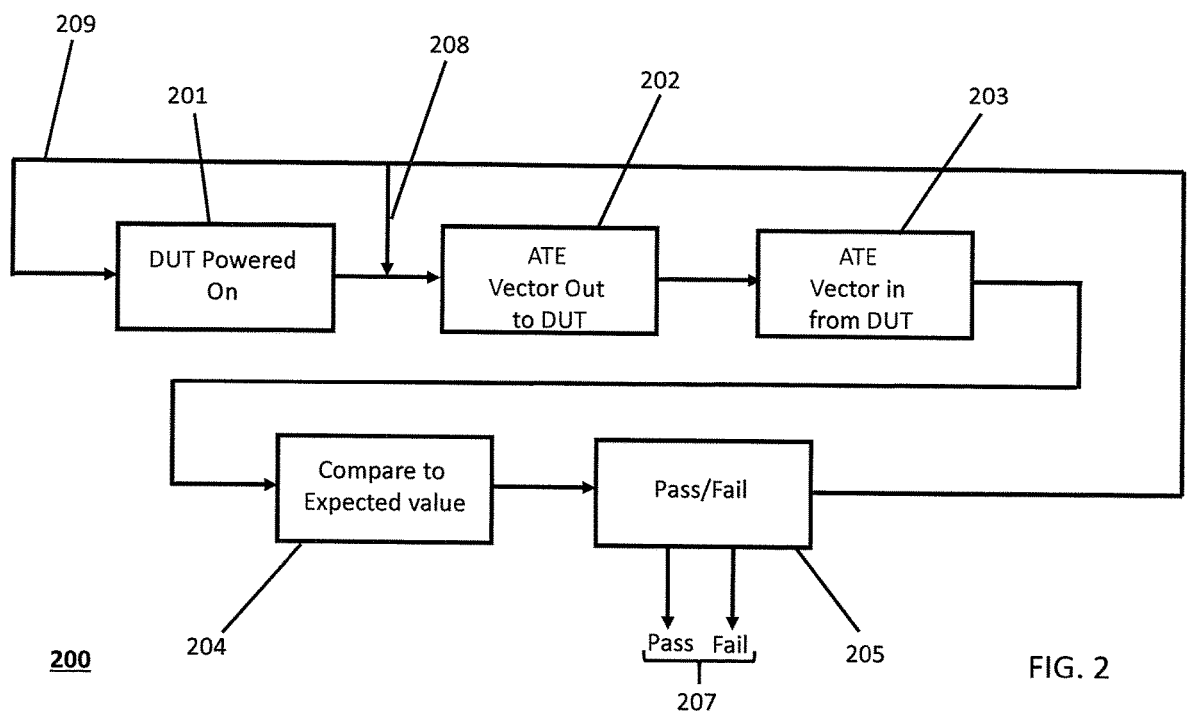
FIG. 2 depicts a flow chart showing test steps in a system for functional testing of an integrated circuit device using an ATE.

FIG. 2 depicts an exemplary set of test steps of a testing process 200 for functional testing of DUT 104 using an ATE 101. The ATE is loaded with test vectors and expected results depending on the DUT 104 to be tested. For example, the DUT 104 may be an integrated circuit (e.g., SOC). The testing process 200 may begin in step 201 in which power is applied to the DUT 104. In step 202, the ATE programming may sequentially drive test vector data out from the ATE 101 to the scan chain(s) 105 and/or input/output connections 106 on the DUT 104. In step 203, the DUT 104 may respond internally to the scan chains 105 and/or input/output connections 106 and produce the DUT 104 output vector data which is sent back to the AT, for example, as ATE vector. In step 204, the ATE 101 compares the output vector data (e.g., ATE vector) with expected values. In step 205, the ATE 101 determines a pass or fail result for the DUT 104 based on the comparison in step 204. In step 207, the determined pass or fail result may be noted and the testing process 200 may proceed to step 209 in which a new DUT 104 is loaded and powered on. In other instances, in step 207, the fail result may be noted and the testing process 200 may proceed to step 208, in which testing of the DUT 104 may be continued with additional input test vectors driven to the DUT.

A System-in-Package (SIP) device typically contains a combination of die, discrete components, and packaged devices integrated onto a substrate and then packaged like a single die semiconductor device. Due to the SIP packaging, the SIP may be tested using an ATE, like the Teradyne J750. However, the die and packaged devices in a SIP may be produced by different manufacturers which results in in several differences between the test methodology for SIPs and SOCs. While both SIPs and SOCs may be referred to as systems, they are different types of systems. Although they are both packaged devices, the SOC is a single semiconductor device, but a SIP is an embedded system containing multiple devices and passive components. Additionally, an SOC typically has test hardware integrated in the SOC as part of the design process for testing purposes. Although the individual devices and components in a SIP may also include such integrated test hardware, the test hardware of each individual device may not be connected to or be aware of the test hardware in any of the other different devices in that same SIP and may even not be pinned out for use in testing of the SIP.

The physical differences between a SIP (e.g., containing multiple devices and components that are interconnected) and a SOC (typically a single die) affect the ability to access any Built-in-Self-Test (BIST) capabilities and the electrical behavior of the device at the pins. In a SOC, the test access points are accessible to the ATE and are not internally connected to other circuitry. In a SIP, test access points for individual devices and components may not be accessible to the ATE, and further, there may be internal connections among devices and components affecting their electrical behavior, in addition to any other testability issues.

In addition, System-in-Package (SIP) manufacturers may not be the manufacturers of the die, components or packaged devices within a SIP. The provider of the Intellectual Property (IP) of the die, components or packaged devices within a SIP could supply the test vectors and expected results, or the necessary information for generation of test vectors to the SIP device manufacturer. However, lack of such information can limit access to the design and simulation data required to produce test vectors for the devices and components in a SIP.

Figure 3:
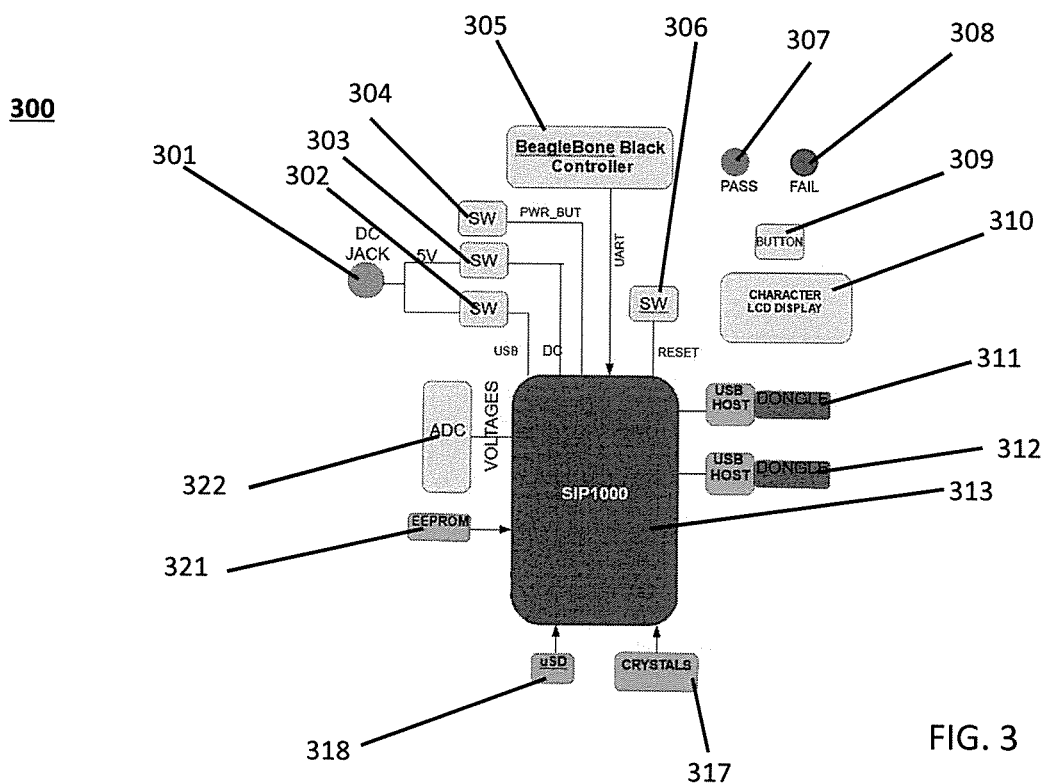
FIG. 3 depicts a block diagram of a system for testing a System in Package (SIP) device according to some embodiments.

FIG. 3 depicts a block diagram of a system 300 for testing a System in Package (SIP) device according to some embodiments. As shown in FIG. 3, the SIP being tested is a Unit Under Test (UUT) 313. The tester may use a microprocessor board computer 305, such as a BeagleBone Black™ board level controller, to perform the production test on the UUT 313. There may be several peripheral devices attached to the UUT 313 that may also be tested in order for all of the aspects of the test to be performed. The peripheral devices could include, but are not restricted to, several switches 302, 303, 304, 306, a memory 321, such as an EEPROM, Analog to Digital Converter (ADC) 322, Crystals 317, uSD 318, and a USB Host with dongles 311, 312. Other devices and components may also be attached to or be part of the UUT 313. The UUT 313 may be powered through a 5 volt DC Jack 301. A start button 309 may be pressed to start the test and after the test is completed either a pass light 307 or a fail light 308 is illuminated based on the test results. A Liquid Crystal Display (LCD) 310 may be included to provide limited diagnostic information. In some instances, the limited diagnostic information, however, does not provide an explanation regarding which internal components of the UUT 313 caused any failures.

Figures 4A, 4B:
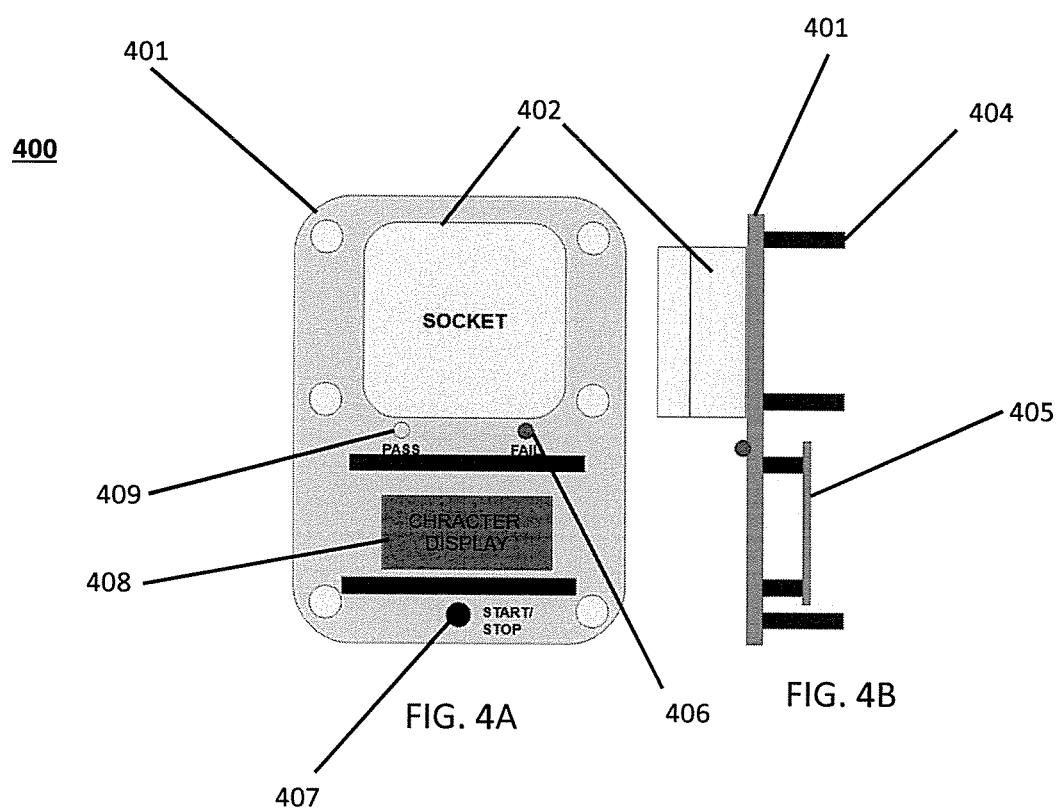
FIGS. 4A-B depict a layout of an emulation board for testing a SIP according to some embodiments.

FIGS. 4A-B depict a top and side view of the physical layout of an embodiment of an emulation board with a socket for testing a SIP. This may be used in connection, for example, with the arrangement shown in FIG. 3. According to some embodiments, FIGS. 4A-B show a top view and side view, respectively, of the mechanical arrangements of the system level SIP tester 300 discussed with respect to FIG. 3.

As shown in FIGS. 4A-B, a test board 401 may comprise a socket 402 configured to receive the UUT 313. A microprocessor board 405 controls the system 400 and may be attached to the back side of a main PC board 401. A start/stop switch 407 is configured to start and stop the tester's 400 routine. In this example, the pass light 409, fail light 406 and the LCD 408 are mounted on the top side of the main PC board 401 and feet 404 are attached to the back of the PC board.

Figure 5:
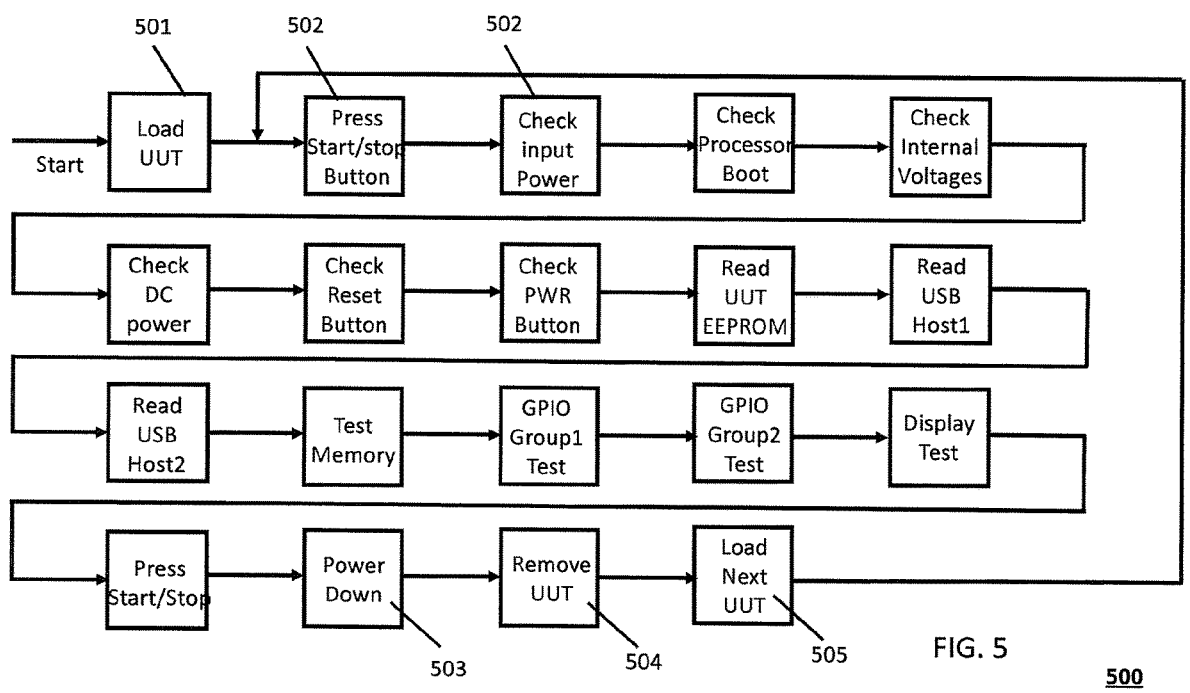
FIG. 5 depicts a flow chart showing test steps in a system for testing a SIP according to some embodiments.

FIG. 5 depicts a simplified flow chart 500 of an exemplary testing process 500 according to some embodiments. Process 500 may be, for instance, for functional testing of a UUT using a tester system, such as the system 300 described in FIG. 3. The testing process 500 may be a function testing for a UUT, such as the UUT 313 described in FIG. 3, using a board, such as the microprocessor board 405 described above in FIGS. 4A-B. In certain aspects, the test process 500 starts in step 501 in which a UUT is loaded into a test socket on the test board. In step 502, a start/stop button is pressed once the UUT is loaded in to the test socket. In this example, a processor, such as the microprocessor on the microprocessor board 405, powers up the UUT and begins to test various aspects of the UUT until the test is completed. For example, the testing of various aspects may include one or more of: checking processor boot of the UUT, checking internal voltages of the UUT and the tester system, checking direct current (DC) power for the tester system, checking a reset button, checking a power button, reading the UUT memory (e.g., EEPROM), reading a first host USB, reading a second host USB, testing memory or the system, conducting a first general-purpose input/output (GPIO) test, conducting a second GPIO test, testing a display of the tester system. While FIG. 5 depicts some tests to be performed by the tester system, actual tests to be conducted depend on the loaded UUT. The types of tests and the number of such tests may be different for a loaded UUT from those depicted in FIG. 5. In step 503, the UUT is powered down once the various tests are complete. In step 504, the UUT is removed from the socket, for instance, while illuminating a pass or fail light for the UUT based on the test result. In step 505, a next UUT is inserted and the test process is once again started at step 502. For some testing processes 500, if one of the tests for a loaded UUT fails, the remaining tests are skipped and the fail light is illuminated. Accordingly, in such cases, the testing process 500 moves on to the next UUT.

Figure 6:
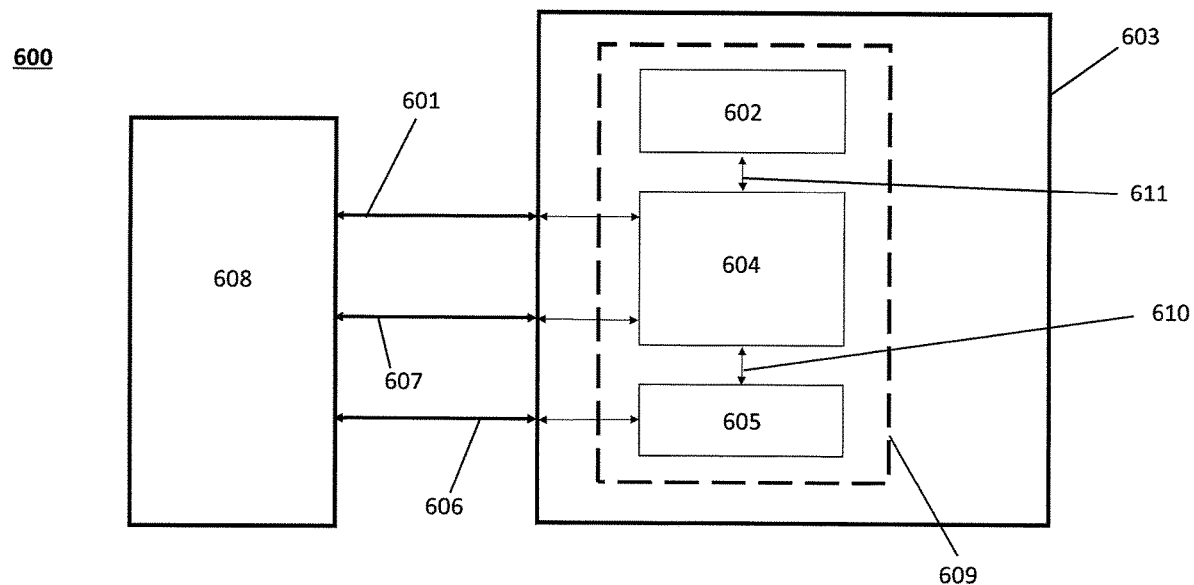
FIG. 6 depicts a diagram of a SIP device according to some embodiments.

FIG. 6 depicts a simplified block diagram of an embodiment of a tester system 600 for testing a SIP device using an ATE. In the example of FIG. 6, a SIP 609 is located on a load board 603 and then electrically connected to an ATE 608 via a scan chain 601 and one or more input/output connections 606, 607. In some embodiments, the SIP 609 may comprise three active components 602, 604, 605. This may be in contrast to the DUT 104 in FIG. 1, where all power lines 107, scan chains 105, and input/output connections 106 may be pinned out and accessible external to the DUT 104. In some embodiments, the three active components 602, 604, 605 may comprise a first and second die 604, 605 and packaged parts 602. Pins within the SIP 609 associated with the multiple die 604, 605 and the packaged part 602 may have discrete components or other die and/or packaged device pins connected to them within the SIP 609 such that the pins for the multiple die 604, 605 and the packaged part 602 cannot be isolated or pinned out. Accordingly, the input and output signals for the three active components 602, 604, 605 may no longer be isolated and may not be entirely accessible on pins 601, 606, 607 external to the SIP 609. Interconnections 610, 611 between the three active components 602, 604, 605 can pose test coverage and method challenges for the ATE 608. More specifically, the interconnections 610, 611 can present a situation in which a first active component 602 does not have an external connection. As shown in FIG. 6, the first active component 602 is connected to a second component 604 and is not connected to any external pins 601, 606, 607. In some embodiments, Built-in-Self-Test (BIST) circuitry integrated in the SIP 609 may enable access to sub-systems not accessible from external pins and reduce the workload of the ATE 608. In such embodiments, the ATE 608 may connect to and indirectly drive inputs (e.g., test input vectors) to the BIST circuitry and collect output data from the BIST circuitry (e.g., test output vectors). Accordingly, the ATE 608 may access the first active component 602 which does not have an external connection by indirectly driving inputs to and receiving output data from the first active component 602 using the BIST circuitry, according to some embodiments. In some embodiments, the second active component 604 and/or a third active component 605 may comprise a microprocessor (uP) for containing a state machine in communication with another state machine in the ATE 608.

Figure 7:
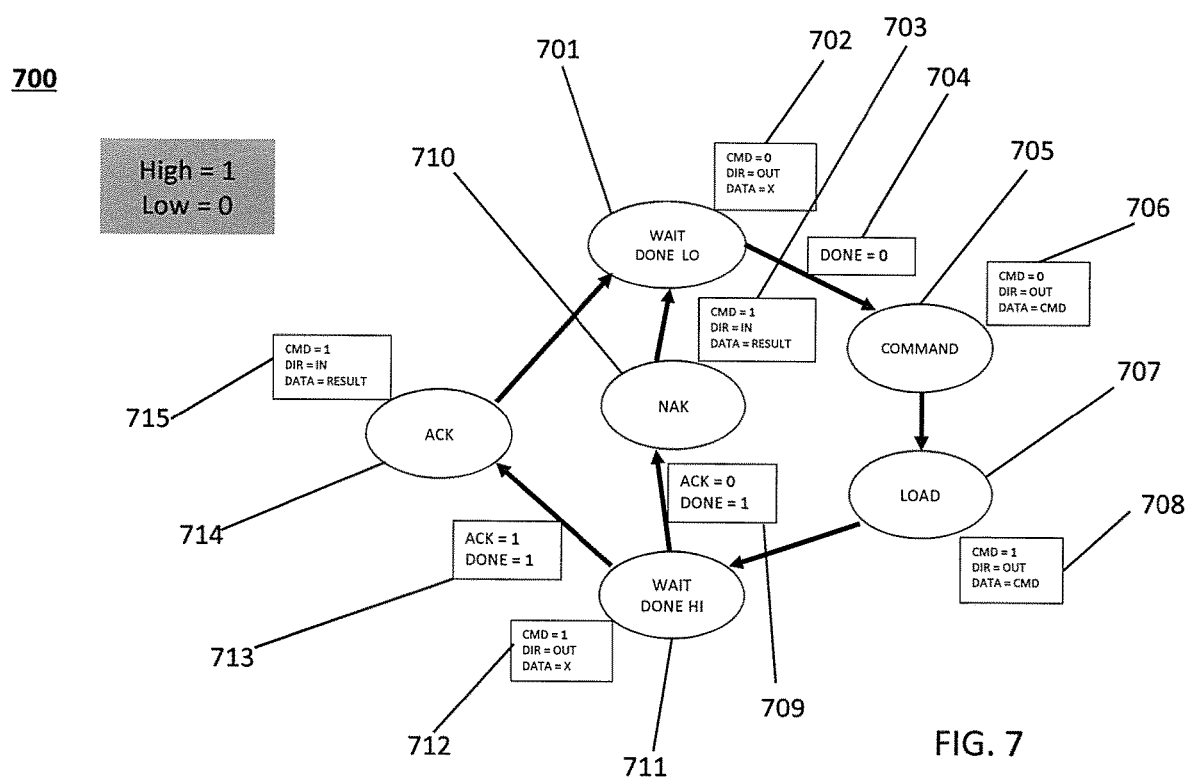
FIG. 7 depicts a state machine for use in an ATE for testing a SIP according to some embodiments.

FIG. 7 depicts an embodiment of a state machine for use in an ATE for testing a SIP. FIG. 7 shows a state machine 700, which can be loaded in the ATE 608 for controlling the interaction between the ATE 608 and a test controller for the SIP (i.e., UUT) 609, from the perspective of an ATE test program. In some embodiments, the test controller for the SIP 609 may be located on the load board 603 or in the SIP 609. In some embodiments the test controller may be at least one of: a microprocessor, a microcontroller, a logic circuit, and configurable logic gates such as a complex logic device (CPLD), a programmable array logic (PAL), and a field-programmable gate array (FPGA). In some embodiments, the ATE based state machine 700 may be a shell comprising a set of commands for controlling the SIP 609 and an executable program that contains a function representation of the one or more tests to be used to test the SIP 609. In some embodiments, the executable program may comprise a second state machine configured to execute the one or more tests in the SIP. Accordingly, in some instances, the contents of the executable program may change as a function of the SIP 609 being tested, but the shell and the set of commands may remain the same and consistent for the state machine 700 in the ATE 608. In some embodiments, the second state machine configured to execute the one or more tests may be running on the test controller, wherein the test controller is located on the load board 603 of the tester or in the SIP 609.

The ATE state machine 700 may first check the load board 603 to ensure that the load board 603 is the correct one and that it has the correct power, voltages and clock frequencies, according to some embodiments. For example, the ATE state machine 700 may verify a serial peripheral interface (SPI) bus of the load board 603 by reading and comparing data on the SPI bus. As another example, local power supplies, such as 5V voltage supplies and 3.3V voltage supplies, and local clock sources, such as a 24 MHz frequency clock and a 32.768 kHz frequency clock, may be verified by the ATE state machine 700. The ATE state machine 700 may then load the executable program in a memory (EEPROM) on the load board 603. In some embodiments, the ATE state machine 700 may check whether an executable program already stored in the memory is the correct version if multiple SIPs are being tested. In some embodiments, the ATE state machine 700 may optionally check at a later time that the executable program stored in a memory in the SIP 609 is correct. Once the load board 603 has been verified by the ATE state machine 700, the SIP 609 is loaded into a socket on the load board 603 for testing. Subsequently, the SIP 609 is powered up and continuity checks are performed by the ATE state machine 700 to verify continuity between the SIP 609 and the load board 603. The test controller (e.g., at least one of the microprocessors on the load board 603 or the SIP 609) to be used for testing the SIP 609 may be held in reset during the powering up of the SIP 609 and the performance of the continuity checks. After the completion of the continuity checks, the ATE state machine 700 may release the test controller from reset and instruct the test controller to access the external memory (EEPROM) on the load board 603 to load and run the executable program to start a SIP state machine for the performance of the one or more tests specified by the executable program for that SIP 609. In some embodiments, the executable program may comprise a functional representation of one or more tests to be performed in the SIP 609 and a state machine configured to execute the one or more tests in the SIP. In some embodiments, the one or more tests may include an initial test that starts with limited tests of the test controller and relevant memory. In some embodiments, the test controller may be located on the load board 603. In such embodiments, the SIP 609 design may include features which allow the test controller located on the load board 603 to run the executable program, thereby controlling and testing the SIP 609.

In some embodiments, the ATE state machine 700 may be in a first waiting (WAIT DONE LO) state 701 to determine whether the test controller for the SIP 609 has successfully loaded the executable program by verifying that a status (DONE) signal has been driven low 716 by the test controller. In the first waiting state 701, the ATE state machine 700 may drive a command (CMD) signal low and set a data bus direction signal to out (DIR=OUT) where data on the data bus is undefined (DATA=X) (as shown in 702). In some embodiments, the ATE state machine 700 may enter a command (COMMAND) state 705 when the ATE state machine 700 detects that the status (DONE) signal is low (704). In the command state 705, the ATE state machine 700 may load a command signal on the data bus (DATA=CMD) (as shown in 706). In some embodiments, the ATE state machine 700 may enter a load (LOAD) state 707 when the ATE state machine 700 indicates that the command signal on the data bus is valid by driving the command (CMD) signal high (CMD=1) (as shown in 708). In some embodiments, the ATE state machine 700 may subsequently enter a second wait (WAIT DONE HI) state 711 until the test controller completes the execution of the executable program according to the command signal. While in the second wait state 711, the ATE state machine 700 may detect that status (DONE) signal has been driven high by the test controller (DONE=1). In such embodiments, the data bus is undefined (DATA=X) (as shown in 712). When the ATE state machine 700 detects that the status (DONE) signal is high, the ATE state machine 700 may read an acknowledge (ACK) signal to determine the state of the ACK signal. In some embodiments, the ATE state machine 700 may detect that the ACK signal is low (ACK=0 as shown in 709) and upon detection of such, the ATE state machine 700 enters a non-acknowledge (NAK) state 710. In some embodiments, the ATE state machine 700 may detect that the ACK signal is high (ACK=1 as shown in 713) and upon detection of such, the ATE state machine 700 enters an acknowledge (ACK) state 714. In both the ACK state 714 and the NAK state 710, the ATE state machine 700 may set data bus direction to in (DIR=IN) 703, 715 and read the test result on the data bus (DATA=RESULT). When the ATE state machine 700 reads the test results in the NAK state 710, the test results may describe a failed test. After the ATE state machine 700 reads the test results in either the ACK state 714 or the NAK state 710, the ATE state machine 700 may enter the first wait (WAIT DONE LO) state 701 to restart the interaction with the test controller until all of the ATE test commands (i.e., the one or more tests specified by the command signal for that SIP 609) have been processed. Once the testing for the SIP 609 is complete, the SIP 609 is powered down and removed from the load board socket.

Although the ATE state machine 700 can be software running on the ATE 608, some embodiments will employ circuitry (or hardware) to implement the ATE state machine 700. In some embodiments a combination of hardware and software may be employed to implement the ATE state machine 700 in the ATE 608. In some embodiments, the ATE 608 may comprise: a data processing apparatus (DPA), which may include one or more processors (e.g., a general purpose microprocessor and/or one or more other processors, such as an application specific integrated circuit (ASIC), field-programmable gate arrays (FPGAs), and the like); and local storage unit (a.k.a., "data storage system"), which may include one or more non-volatile storage devices and/or one or more volatile storage devices (e.g., random access memory (RAM)). In embodiments where the ATE 608 includes a general purpose microprocessor, a computer program product (CPP) may be provided. The CPP can include a computer readable medium (CRM) storing a computer program (CP) comprising computer readable instructions (CRI). The CRM may be a non-transitory computer readable medium, such as, but not limited, to magnetic media (e.g., a hard disk), optical media, memory devices (e.g., random access memory), and the like. In some embodiments, the ATE 608 may be configured to perform steps described herein without the need for code. That is, for example, the data processing apparatus may include one or more ASICs. Hence, the features of the embodiments described herein may be implemented in hardware and/or software.

Figure 8:
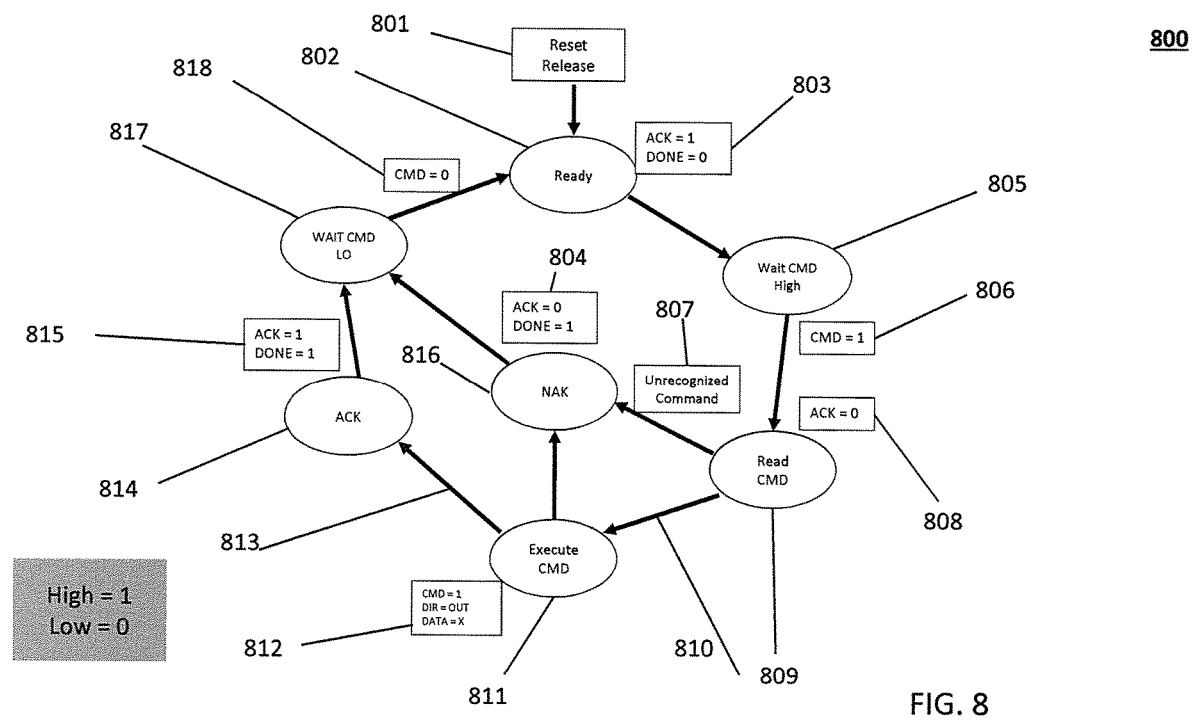
FIG. 8 depicts a state machine for use in a test controller for testing a SIP according to some embodiments.

FIG. 8 depicts an embodiment of a state machine. The state machine may be used, for instance, in a test controller for use with an ATE for testing a SIP. In this example, FIG. 8 shows a state machine 800 for use in a test controller, wherein the test controller may be located on a load board 603 for the ATE 608 or the SIP 609. In some embodiments the test controller may be at least one of: a microprocessor, a microcontroller, a logic circuit, and configurable logic gates, such as a complex logic device (CPLD), a programmable array logic (PAL), and a field-programmable gate array (FPGA). In some embodiments, the test controller state machine 800 may control interactions between the ATE 608 and BIST state machines (also referred to as self-testing software processes) in the SIP 609. At the start of testing, the ATE state machine 700 releases a test controller reset signal (801), thereby causing the test controller state machine 800 to begin operation by entering a ready (READY) state 802. In some embodiments, the test controller state machine 800 sends an indication to the ATE state machine 700 that the test controller is ready and enters a first wait (WAIT CMD HIGH) state 805. In the first wait state 805, the test controller state machine 800 may detect that the ATE state machine 700 has issued a command by detecting a high command (CMD) control signal asserted by the ATE state machine 700. In such embodiments, the test controller state machine 800 may enter a read (READ CMD) state 809, in which the test controller state machine 800 reads the command. In some embodiments, the command may not be implemented or not recognized (807) by the test controller state machine 800. In such embodiments, the test controller state machine 800 may enter a negative acknowledge (NAK) state 816 and an acknowledge (ACK) signal driven to low is sent to the ATE state machine 700.

In some embodiments, the command may be recognized by the test controller state machine 800 as valid. In such embodiments, the test controller state machine 800 may enter an execute (EXECUTE CMD) state 811, in which the command is executed. In some embodiments, executing the command may comprise retrieving one or more tests to be performed on the SIP. In some embodiments, executing the command may comprise conducting the retrieved one or more tests in the SIP in accordance to the command. In some embodiments, the result of the executed command may not be valid or recognized by test controller state machine 800. Accordingly, the test controller state machine 800 may enter the NAK state 816 and send an indication to the ATE state machine 700 by driving the ACK signal to low. In some embodiments, the test controller state machine 800 may transmit fails test results in the NAK state 816. In other embodiments, the result of the executed command may be valid. Accordingly, the test controller state machine 800 may enter an acknowledge (ACK) state 814 and send an indication to the ATE state machine 700 by driving the ACK signal to high. In some embodiments, the test controller state machine 800 may transmit the test results on the data bus in the ACK state 814. Finally, the test controller state machine 800 may enter a second wait (WAIT CMD LO) state 817, in which the test controller state machine 800 waits for the ATE state machine 700 to read the data (e.g., the test results) on the data bus and indicate when to proceed to the initial ready state 802. In some embodiments, the ATE state machine 700 may drive the command (CMD) control signal low to provide an indication to the test controller state machine 800 to enter the ready state 802. In some embodiments, the ATE state machine 700 may send a command to the test controller state machine 800 to provide the results for each of the tests by test number or other test identifier.

Although the test controller state machine 800 can be software running on the test controller, some embodiments will employ circuitry (or hardware) to implement the test controller state machine 800. In some embodiments a combination of hardware and software may be employed to implement the test controller state machine 800 in the test controller. In some embodiments, the test controller may comprise: a data processing apparatus (DPA), which may include one or more processors (e.g., a general purpose microprocessor and/or one or more other processors, such as an application specific integrated circuit (ASIC), field-programmable gate arrays (FPGAs), and the like). In some embodiments, the DPA may further include a local storage unit (a.k.a., "data storage system"), which may include one or more non-volatile storage devices and/or one or more volatile storage devices (e.g., random access memory (RAM)). In embodiments where the test controller includes a general purpose microprocessor and/or one or more other processors, such as an ASIC, FPGA, and the like, a computer program product (CPP) may be provided. The CPP can include a computer readable medium (CRM) storing a computer program (CP) comprising computer readable instructions (CRI). The CRM may be a non-transitory computer readable medium, such as, but not limited, to magnetic media (e.g., a hard disk), optical media, memory devices (e.g., random access memory), and the like. In some embodiments, the test controller may be configured to perform steps described herein without the need for code. That is, for example, the data processing apparatus may include one or more ASICs. Hence, the features of the embodiments described herein may be implemented in hardware and/or software.

Figure 9:
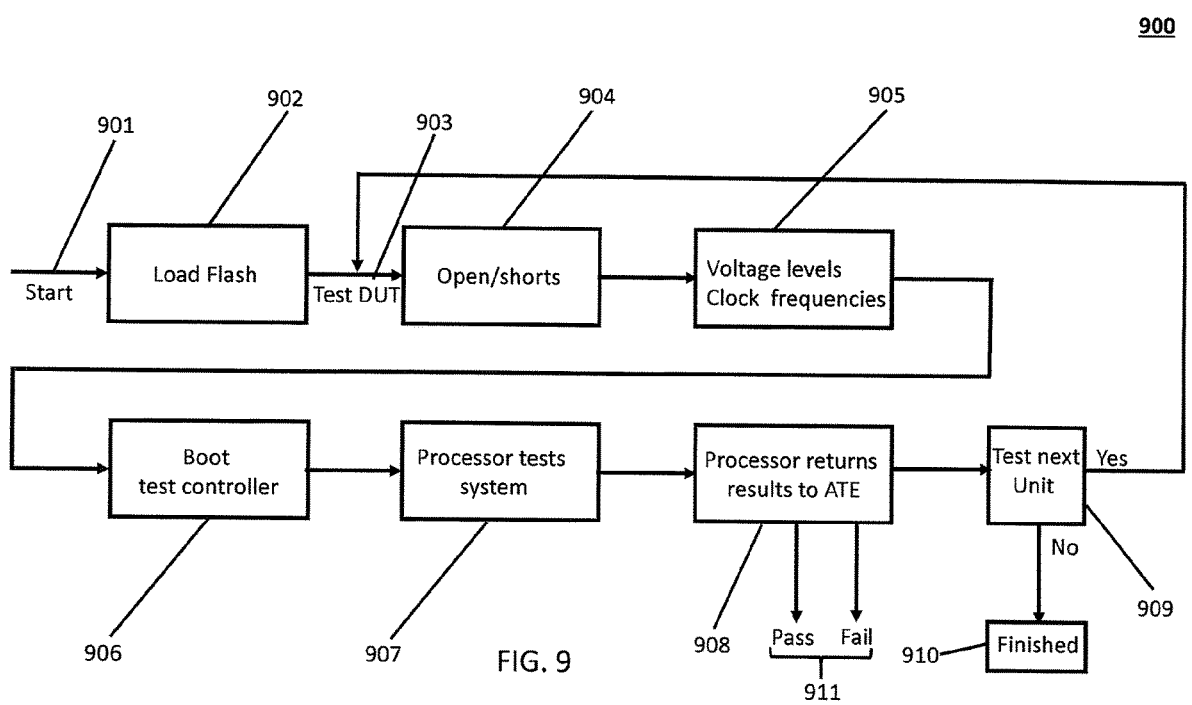
FIG. 9 depicts a flow chart showing a sequence of functional according to some embodiments.

FIG. 9 depicts a sequence of functional tests that may be performed on a SIP using an ATE and state machines according to some embodiments. In this example, FIG. 9 shows a process 900 of a SIP test using an ATE machine. In the embodiment shown in FIG. 9, the ATE state machine 700 described in FIG. 7 and the test controller state machine 800 described in FIG. 8 may be utilized to conduct the SIP test. That is, interactions between a test controller and the ATE 608 throughout the process 900 may be in accordance with the state machines 700, 800 described in FIGS. 7 and 8. The process 900 may begin in step 901 in which a new lot of SIPs are ready to be tested. In some embodiments, the load board 603 may be powered and verified as a first step of the process 900. In such embodiments, contents already stored in a memory (EEPROM) on the load board 603 may be verified or contents may be loaded on the memory (EEPROM) of the load board 603. In step 902, the ATE 608 may load the memory (EEPROM) on the load board 603 with executable programs each of the Units under Test (UUTs) (also referred to as the SIP 609 in FIGS. 6-8) will conduct to perform the system test. In some embodiments, an executable program may comprise a functional representation of one or more tests to be performed in the UUT and a state machine configured to execute the one or more tests in the UUT. In step 903, a production test is initiated for a first UUT once the first UUT is placed on the load board. In step 904, a first test is conducted on the first UUT. In some embodiments, the first test is an opens/shorts test. The opens/shorts test is conducted by the ATE 608 to make sure all of the external connections of the first UUT (pins and/or balls) are correctly in place. In some embodiments, continuity tests may be executed by the ATE 608 on accessible inputs and outputs in step 904 before power is applied to the first UUT. For example, a continuity check may be performed by verifying continuity between a ground pin and an input pin on the first UUT. As another example, another continuity check may be performed by verifying continuity between an input pin on the first UUT and a local voltage pin (Vcc). Based on a determination that the first UUT passed the tests in step 904, the process 900 moves on to step 905. In step 905, the ATE 608 applies power to the first UUT in order to test the first UUT for proper voltages and clock frequencies. In some embodiments, the ATE 608 may measure voltage levels for the first UUT and compare the measured voltage levels to test limits. For example, power management integrated circuit (PMIC) output voltage may be measured and compared with an input voltage. Based on a determination that the first UUT passes the tests in steps 904 and 905, the process 900 moves on to step 906 in which the ATE 608 causes the test controller to boot up and load the executable program 906 from the memory (EEPROM). In some embodiments, the test controller may be located on the first UUT. In other embodiments, the test controller may be located on the load board. The ATE 608 may release the test controller from reset and cause the test controller to boot up and access the memory (EEPROM) to load the executable programs. In some embodiments, the test controller reset release and the test controller boot up may be verified. In step 907, once the test controller has booted up properly, the test controller performs the executable program and self-tests along with testing the rest of the first UUT in accordance to the executable program. In some embodiments, commands from the ATE 608 may determine the tests to be executed by the test controller. For example, tests to be executed by the test controller may include, but not restricted to, a MAC ID read, a DRAM test, a general-purpose input/output (GPIO) test, an analog-to-digital converter (ADC) test, and a 1 GHz test. In step 908, the test controller returns the results of the tests to the ATE 608. In step 911, the ATE 608 determines whether the first UUT is good or faulty based on the results of the test received from the test controller and the results of the opens/shorts test and the voltage clock test. After the ATE 608 determines whether the first UUT is good or faulty, the process 900 restarts in step 909 for a new UUT placed on the load board 603. In the alternative, the process 900 may end in step 910 in which the test activity for the present lot of SIPs is complete. In some embodiments, the ATE 608 may sort the first UUT based on the determinations made throughout the process 900. For example, the ATE 608 may determine that the first UUT is a 1 GHz speed grade or a 800 MHz speed grade, that the PMIC output voltage for the first UUT test limit has been exceeded, that a functional test limit for the first UUT has been exceeded or failed, and that the continuity test limit has been exceeded. Accordingly, the ATE 608 may sort the first UUT in different bins based on the determinations made throughout the process 900.

Figure 10:
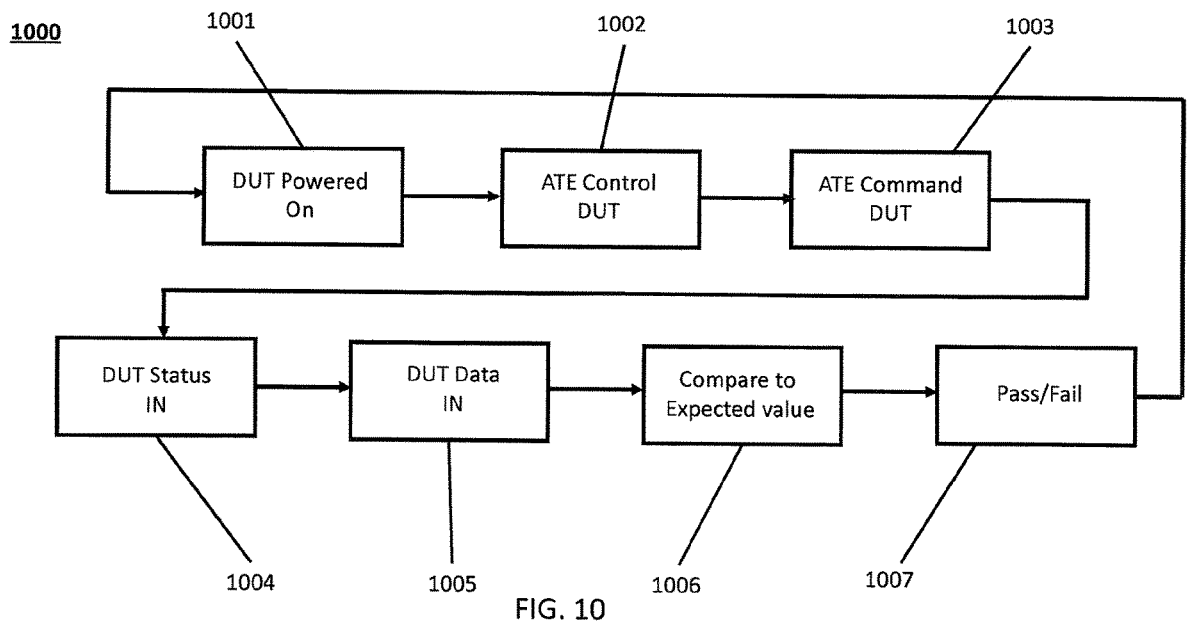
FIG. 10 depicts a flow chart showing functional steps of an ATE state machine and a test controller state machine according to some embodiments.

FIG. 10 is a flow chart showing a process 1000 of functional steps of an ATE state machine and a test controller state machine according to some embodiments. As shown in FIG. 10, the process 1000 beings with applying power to a UUT (also referred to as the SIP 609 in FIGS. 6-8). In step 1002, the test controller state machine 800 may respond to control signals sent from the ATE state machine 700. In step 1003, the test controller state machine 800 may load commands transmitted by the ATE state machine 700. In some embodiments, the commands may comprise a functional representation of one or more tests to be performed in the UUT. In step 1004, the test controller state machine 800 may execute the loaded commands and produce status information for the ATE state machine 700. In some embodiments, the produced status information may indicate to the ATE state machine 700 when test results are valid on the data signals in the interface between the test controller state machine 800 and the ATE state machine 700. In step 1005, the ATE state machine 700 may read the data (e.g., test results) from the interface. In step 1006, the ATE state machine 700 may compare the test results to expected values. In step 1007, the ATE state machine 700 may determine whether the UUT passes or fails the tests based on the comparison in step 1006.

Figure 11:
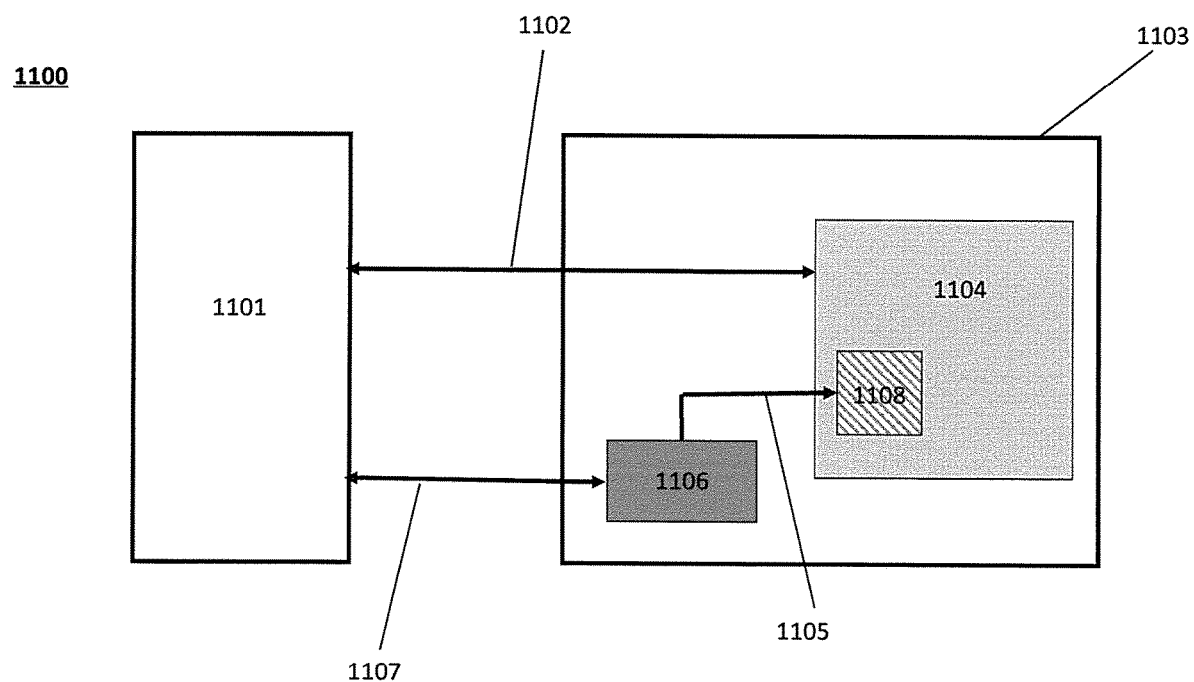
FIG. 11 depicts a SIP on a load board according to some embodiments.

FIG. 11 depicts a SIP on a load board comprising a memory component, according to some embodiments. As shown in FIG. 11, the SIP 1104 (e.g., SIP 609 in FIGS. 6-8) comprises a microprocessor 1108. The SIP 1104 may be located on a load board 1103 (e.g., load board 603 in FIGS. 6-8) comprising a memory 1106. In some embodiments, the memory 1106 is a non-volatile memory such as an EEPROM. However, it is not required that the memory 1106 be a non-volatile memory and other types of memory may be employed in alternative embodiments. FIG. 11 illustrates how the SIP 1104 can be tested using a standard component ATE machine (tester) 1101 (e.g., ATE 608 in FIGS. 6-8). Improving test coverage for the SIP 1104 may be accomplished by interfacing the microprocessor 1108 to the ATE 1101 with a control and data interface 1102 implemented on the load board 1103 or within the SIP 1104. In this embodiment, the microprocessor 1108 is used as a test controller for the SIP tests. The load board 1103 may comprise a microprocessor which may be used as the test controller for the SIP tests in alternative embodiments. In some embodiments, the test controller may be located on the SIP 1104 or the load board, where the test controller may be a microcontroller, a logic circuit, and configurable logic gates, such as a complex logic device (CPLD), a programmable array logic (PAL), and a field-programmable gate array (FPGA). As shown in FIG. 11, the memory 1106 is accessible by the ATE 1101 for programming and verification of test commands via direct connections 1107 according to some embodiments. The test controller is electrically connected to the memory 1106 and may be configured to access, load, and execute commands stored by the ATE 1101.

In some embodiments, the memory 1106 may be located within the SIP 1104. In such embodiments, after initially testing the SIP 1104 for opens/shorts and correct voltages/clocks as described above in FIG. 9, the ATE 1101 may initialize a SIP internal test procedure by loading an executable program into the memory 1106. In some embodiments, the memory may be on the load board 1103, as shown in FIG. 11. In such embodiments, the ATE machine 1101 may load an executable program into the memory 1106 once for all SIPs 1104 in a SIP batch to be tested. In some embodiments, the executable program may comprise a functional representation of one or more tests to be performed in the SIPs and a state machine configured to execute the one or more tests in the SIPs. Subsequently, the ATE machine 1101 may cause the microprocessor 1108 (i.e., the test controller in this embodiment) to load the executable program in the microprocessor after the SIP 1104 has been inserted into the load board 1103 and initial tests, such as tests for opens/shorts and correct voltages/clocks as described above in FIG. 9, are successfully completed by the ATE 1101.

According to some embodiments, the test controller may self-test and then test the complete system contained in the SIP 1104 in accordance to the executable program is loaded into the test controller. In some embodiments, this testing process can either be done independently of the ATE machine 1101 or interactively with the ATE machine 1101 utilizing the control and data interface 1102. In some embodiments, the tests for the SIP 1104 may be a sequential set of tests followed by composite reports from that sequence. In other embodiments, the tests for the SIP 1104 may comprise a sequence of a first test followed by a first report, a second test followed by a second report and so forth with a new test followed by a new report. Depending on the test procedure, the testing may stop when one test fails or the test procedure may continue testing with the failed test noted and/or recorded. Once the test controller has completed the test procedure, the test controller may send the test results to the ATE machine 1101 via the control and data interface 1102. In some embodiments, the load board 1103 may comprise multiple sockets for multiple UUTs. Accordingly, testing for each UUT may proceed in parallel.

In certain aspects, the ATE machine 1101 instructs the test controller to load the test programs from the memory 1106. Subsequently, the test controller may execute the test programs while the ATE machine 1101 waits for the test controller to report the test results. In some aspects, the test sequence, the ATE machine 1101, the SIP 1104, and the test controller 1108 interact according to the disclosed embodiments provided herein to conduct a thorough test of the SIP 1104.

Figure 12:
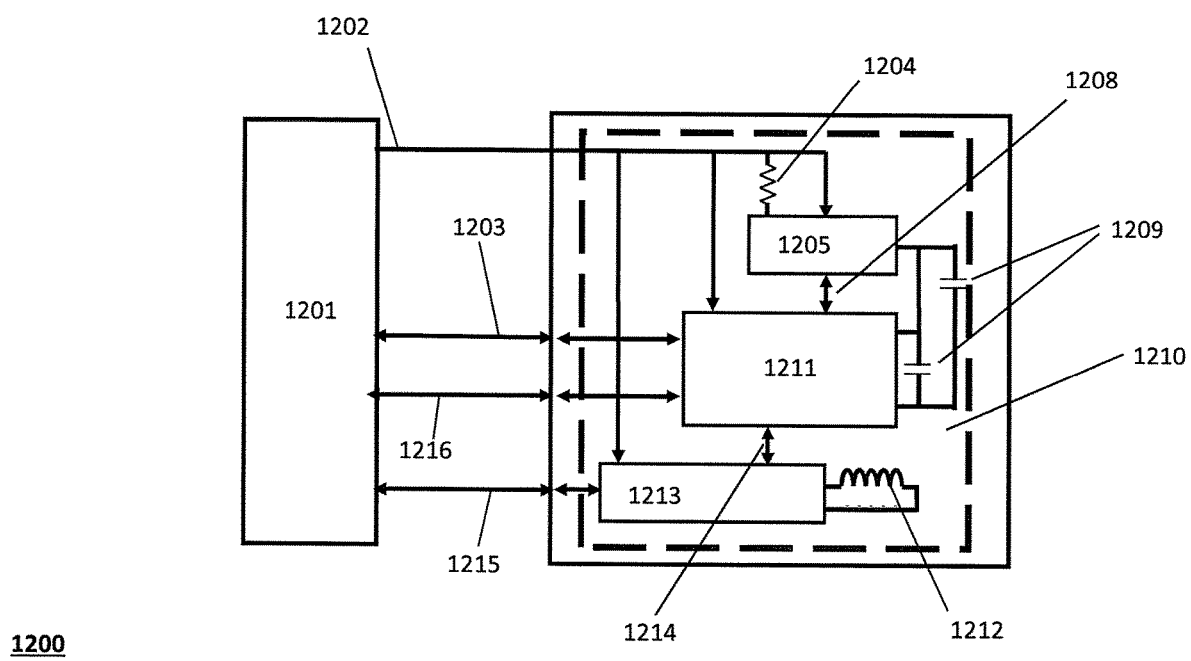
FIG. 12 an ATE arranged to test a SIP according to some embodiments.

FIG. 12 depicts an embodiment of an ATE arranged to test a SIP. In contrast to a single die semiconductor device, the SIP 1210 of this example comprises multiple die and packaged devices 1205, 1211, 1213 which are interconnected via interconnects 1208, 1214 and also connected to additional components required for operation of the SIP 1210, such as passive components including resistors 1204, capacitors 1209, and inductor 1212. As shown in FIG. 12, the multiple die and packaged devices 1205, 1211, 1213 are connected to a shared power distribution network 1202, according to some embodiments. Due to the multiple die and packaged devices 1205, 1211, 1213 and complex interconnections, the signals for the multiple die and packaged devices 1205, 1211, 1213 are no longer isolated and not entirely accessible externally from the SIP 1210 via scan chains 1203 and input/output connections 1215, 1216. The passive components 1204, 1209, 1212 and interconnections pose test coverage and method challenges for the ATE machine 1201 because all of the pins for the multiple die and packaged devices 1205, 1211, 1213 are no longer available for use by the ATE machine 1201. Such challenges may be overcome by the embodiments disclosed herein.

Figure 13:
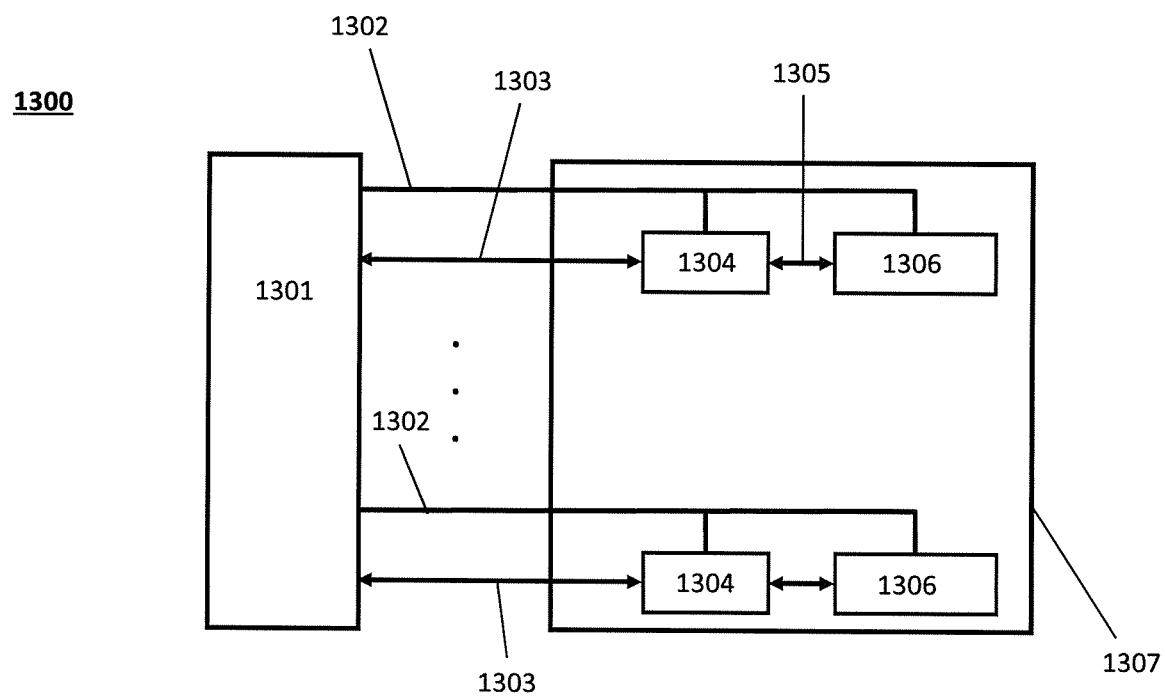
FIG. 13 depicts multiple test controllers on a load board according to some embodiments.

FIG. 13 depicts one embodiment of multiple test controllers on the load board configured to test multiple SIPs with an ATE machine. As shown in FIG. 13, the interaction between an ATE machine and a test controller configured to conduct a test on a SIP, as explained in the disclosed embodiment with relation to FIGS. 6-11, may be expanded to an ATE machine 1301 testing multiple SIPs 1306. In some embodiments, the multiple SIPs may be tested simultaneously or in a predetermined sequence. In some embodiments, an ATE machine 1301 may have sufficient channel quantity to power multiple SIPs 1306 via multiple power lines 1302 and implement multiple test controller interfaces 1303 to each of the multiple SIPs 1306. In some embodiments, the multiple test controllers 1304 may be located on the load board 1307 or in each of the multiple SIPs 1306. In some embodiments, the test controller may be a microcontroller, a logic circuit, and configurable logic gates, such as a complex logic device (CPLD), a programmable array logic (PAL), and a field-programmable gate array (FPGA).

Figure 14:
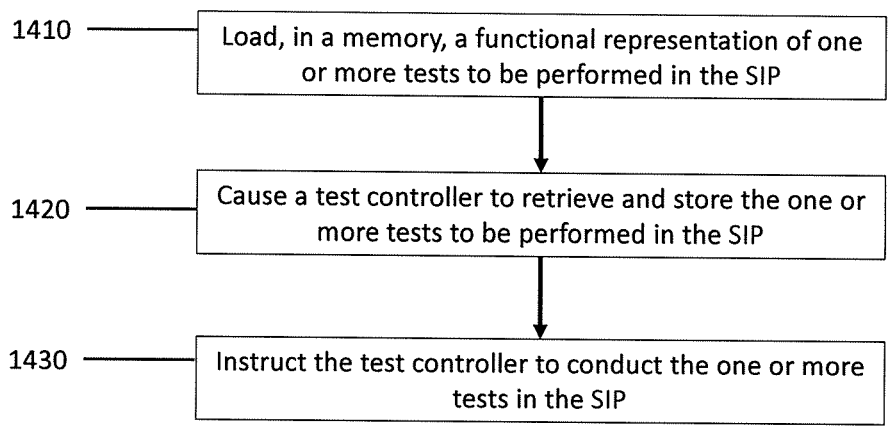
FIG. 14 is a flow chart illustrating a process according to some embodiments.

Referring now to FIG. 14, according to some embodiments, a process 1400 performed by an Automatic Test Equipment (ATE) machine for testing a System-in-a-Package (SIP) using the ATE machine is provided. The process may begin, for instance, with step 1410 in which a functional representation of one or more tests to be performed in the SIP is loaded in a memory located on a load board. In some embodiments, the load board is located on the ATE. In some embodiments, the test controller may be located on at least one of: the load board and the SIP. In some embodiments, the test controller is one of: a microprocessor, a microcontroller, a logic circuit, and configurable logic gates. In some embodiments, a state machine configured to execute the one or more tests in the SIP is loaded in the memory.

In step 1420, a test controller is caused to retrieve and store the one or more tests to be performed in the SIP. In some embodiments, the test controller is caused to retrieve and store the state machine in the test controller. In some embodiments, the test controller is configured to use the state machine to conduct the one or more tests in the SIP. In step 1430, the test controller is instructed to conduct the one or more tests in the SIP.

In some embodiments, the process 1400 may include a step in which the load board is verified before loading the functional representation of one or more tests in the memory in step 1410. In such embodiments, said loading may be performed after verifying the load board. In some embodiments, the process 1400 may include a step in which a first test is conducted to confirm proper external connections of the SIP before causing the test controller to retrieve and store the one or more tests in step 1420. In such embodiments, the process 1400 may include another step in which a second test is conducted to measure and compare one or more of: voltage levels and clock frequencies of the SIP before causing the test controller to retrieve and store the one or more tests in step 1420.

In some embodiments, the process 1400 may include a step in which test results from the test controller may be received for each of the one or more tests. In such embodiments, the process 1400 may include a further step in which the test controller is controlled to: (1) continue conducting the one or more tests or (2) conclude conducting the one or more tests after receiving a test result for each of the one or more tests.

In some embodiments, the process 1400 may include a step in which the ATE machine determines whether the SIP correctly passed the one or more tests based on the received test results. In such embodiments, the process 1400 may include another step in which the SIP is routed to an appropriate bin based on the determination of whether the SIP correctly passed all of the one or more tests.

According to some embodiments, a computer program product comprising a non-transitory computer readable medium storing a computer program for testing a System-in-a-Package (SIP) using an Automatic Test Equipment (ATE) machine is provided. The computer program may comprise computer program code which, when run on the ATE machine, causes the ATE machine to perform a set of operations including the process 1400 and related embodiments as described above.

Figure 15:
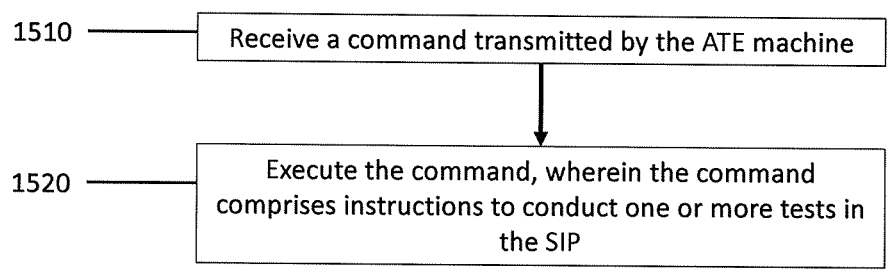
FIG. 15 is a flow chart illustrating a process according to some embodiments.

Referring now to FIG. 15, according to some embodiments, a process 1500 performed by a test controller for testing a System-in-a-Package (SIP) using an Automatic Test Equipment (ATE) machine is provided. The process may begin, for instance, with step 1510 in which the test controller receives a command transmitted by the ATE machine. In some embodiments, the test controller is located in at least one of: the load board and the SIP. In some embodiments, the test controller is one of: a microprocessor, a microcontroller, a logic circuit, and configurable logic gates. In some embodiments, the load board comprises a memory, said memory comprising the one or more tests to be performed in the SIP and a state machine configured to execute the one or more tests in the SIP.

In step 1520, the test controller executes the command, wherein the command comprises instructions to conduct one or more tests in the SIP. In some embodiments, executing the command may comprise the test controller retrieving the one or more tests from the memory. In some embodiments, executing the command may comprise the test controller retrieving the state machine from the memory and using the state machine to conduct the one or more tests in the SIP.

In some embodiments, the process 1500 may include a step in which the test controller determines whether the command signal is valid. In such embodiments, the test controller may execute the command as a result of determining that the command signal is valid.

In some embodiments, the process 1500 may include a step in which the test controller determines whether a result of the executed command is valid. In such embodiments, the test controller may send the results of the one or more tests to the ATE machine as a result of determining that the result of the executed command is valid.

According to some embodiments, a computer program product comprising a non-transitory computer readable medium storing a computer program for testing a System-in-a-Package (SIP) using an Automatic Test Equipment (ATE) machine is provided. The computer program may comprise computer program code which, when run on a test controller, causes the test controller to perform a set of operations including the process 1500 and related embodiments as described above.

Figure 16:
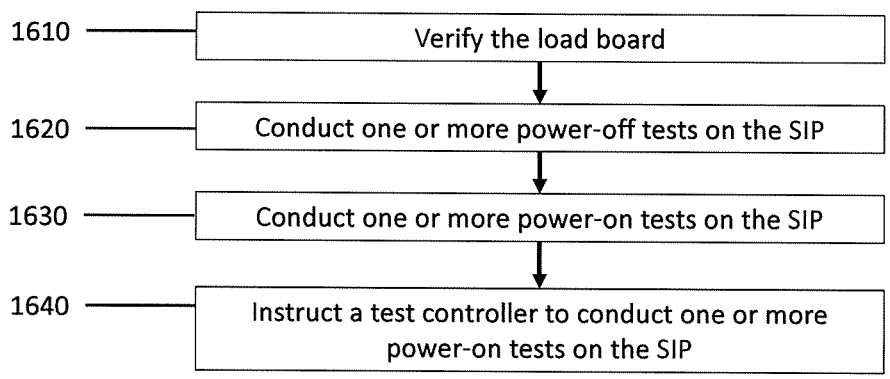
FIG. 16 is a flow chart illustrating a process according to some embodiments.

Referring now to FIG. 16, according to some embodiments, a process 1600 for testing a System-in-a-Package (SIP) using an Automatic Test Equipment (ATE) machine is provided. In some embodiments, the ATE machine may comprise a load board. The process may begin, for instance, with step 1610 in which the ATE machine verifies the load board. In step 1620, the ATE machine conducts one or more power-off tests on the SIP. In some embodiments, the SIP is loaded on the load board and the one or more power-off tests comprise a continuity test. In step 1630, the ATE machine conducts one or more power-on tests on the SIP. In some embodiments, the one or more power-on tests comprise voltage measurements. In step 1640, the ATE machine instructs a test controller to conduct one or more power-on tests in the SIP by performing a process comprising releasing a reset for the test controller and verifying the test controller boot. In some embodiments, the test controller is located on one of the load board and the SIP. In some embodiments, the test controller is one of: a microprocessor, a microcontroller, a logic circuit, and configurable logic gates. In some embodiments, the one or more power-on tests conducted by the test controller may comprise a MAC ID read, a DRAM test, a general purpose input output (GPIO) test, an analog-to-digital converter (ADC) test, and one or more frequency tests.

In some embodiments, the process 1600 may include a step in which the ATE machine determines whether the SIP correctly passed the one or more power-off tests and the one or more power-on tests. In such embodiments, the ATE machine may sort the SIP to an appropriate bin based on the determination of whether the SIP correctly passed the one or more power-off tests and the one or more power-on tests.

While various embodiments of the present disclosure are described herein, it should be understood that they have been presented by way of example only, and not limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A method performed by an Automatic Test Equipment (ATE) machine for testing a System-in-a-Package (SIP) using the ATE machine, the method comprising:
   the ATE loading, into a memory, a state machine configured to execute one or more tests in said SIP under test and a functional representation of one or more tests to be performed in said SIP under test, wherein the memory is located on a load board, and said load board is a separate device connected to said ATE machine;
   causing a test controller to retrieve and store from said memory said state machine and to retrieve and store the one or more tests to be performed in the SIP under test, wherein said test controller is one of a microprocessor, a microcontroller, a logic circuit, and configurable logic gates, and
   instructing said test controller to conduct the one or more tests in said SIP under test.

2. The method of claim 1, wherein said test controller is configured to use said state machine to conduct the one or more tests in said SIP under test.

3. The method of claim 1, further comprising:
   verifying the load board before said loading in said memory, and
   after verifying the load board, performing said loading.

4. The method of claim 3, further comprising:
   conducting a first test to confirm proper external connections of said SIP under test with said load board before causing the test controller to retrieve and store the one or more tests.

5. The method of claim 4, further comprising:
   conducting a second test to measure and compare one or more of voltage levels and clock frequencies of said SIP under test before causing the test controller to retrieve and store the one or more tests.

6. The method of claim 1, further comprising:
   receiving test results from said test controller for each of the one or more tests,
   after receiving a test result for each of the one or more tests, controlling the test controller to (1) continue conducting the one or more tests or (2) conclude conducting the one or more tests, and
   determining whether the SIP under test correctly passed the one or more tests based on the received test results.

7. The method of claim 6, further comprising:
   routing the SIP to an appropriate bin based on the determination of whether the SIP under test correctly passed all of the one or more tests.

8. The method of claim 1, wherein the test controller is located on said load board.

9. The method of claim 1, wherein the test controller is located on said SIP under test.

10. The method of claim 9, wherein said loading into memory is performed using a first connection between the ATE and the memory on said load board, and wherein at least one of: (i) said causing the test controller to retrieve and store, and (ii) said instructing, are performed using a second connection between the ATE and the SIP under test.

11. The method of claim 10, wherein said retrieving and storing by the test controller is performed using a third connection between the memory on said the load board and the SIP under test.

12. A computer program product comprising a non-transitory computer readable medium storing a computer program for testing a System-in-a-Package (SIP) using an Automatic Test Equipment (ATE) machine, the computer program comprising computer program code which, when run on said ATE machine, causes said ATE machine to perform a set of operations comprising:
   loading, into a memory, a functional representation of one or more tests to be performed in the SIP under test and a state machine configured to execute the one or more tests, wherein the memory is located on a load board, and said load board is a separate device connected to said ATE machine;
   causing a test controller to retrieve and store, from said memory, the state machine and the one or more tests to be performed in the SIP under test; and
   instructing the test controller to conduct the one or more tests in the SIP under test.

13. The computer program product of claim 12, wherein said test controller is configured to use said state machine to conduct the one or more tests in said SIP under test.

14. The computer program product of claim 12, the computer program comprising computer program code which, when run on said ATE machine, causes said ATE machine to perform a set of operations further comprising:
 verifying the load board before loading the functional representation of one or more tests in the memory, and after verifying the load board, performing said loading.

15. The computer program product of claim 14, the computer program comprising computer program code which, when run on said ATE machine, causes said ATE machine to perform a set of operations further comprising:
 conducting a first series of tests to confirm proper external connections of the SIP and conducting a second series of tests to measure and compare one or more of voltage levels and clock frequencies of the SIP under test, before causing said test controller to retrieve and load the one or more tests.

16. The computer program product of claim 15, the computer program comprising computer program code which, when run on said ATE machine, causes said ATE machine to perform a set of operations further comprising:
 receiving test results from the test controller for each of the one or more tests, after receiving a test result for each of the one or more tests, controlling the test controller to (1) continue conducting the one or more tests or (2) conclude conducting the one or more tests, and determining whether the SIP correctly passed the one or more tests based on the received test results.

17. The computer program product of claim 16, the computer program comprising computer program code which, when run on said ATE machine, causes said ATE machine to perform a set of operations further comprising:
 routing said determining whether the SIP correctly passed the one or more tests based on the received test results SIP under test to an appropriate bin based on the determination of whether the SIP correctly passed all of the one or more tests.

18. A method for testing a System-in-a-Package (SIP) using an Automatic Test Equipment (ATE) machine, said ATE machine comprising a load board, the method comprising:
 verifying said load board using said ATE machine;
 conducting one or more power-off tests on the SIP, wherein the SIP is loaded on the load board and wherein the one or more power-off tests comprise a continuity test using said ATE machine;
 conducting one or more power-on tests on the SIP, wherein the one or more power-on tests comprise voltage measurements using said ATE machine; and
 instructing a test controller to conduct one or more power-on tests in the SIP by performing a process comprising releasing a reset for the test controller and verifying a boot of the test controller,
 wherein the test controller is located on one of the load board and the SIP, and
 wherein the one or more power-on tests conducted by the test controller comprises a MAC ID read, a DRAM test, a general purpose input output (GPIO) test, an analog-to-digital converter (ADC) test, and one or more frequency tests.

19. The method of claim 18, wherein the test controller is one of:
 a microprocessor, a microcontroller, a logic circuit, and configurable logic gates.

20. The method of claim 19, further comprising:
 determining whether the SIP correctly passed the one or more power-off tests and the one or more power-on tests using said ATE machine; and
 sorting the SIP under test to an appropriate bin based on the determination of whether the SIP correctly passed the one or more power-off tests and the one or more power-on tests using said ATE machine.

\* \* \* \* \*